United States Patent [19]
Jurgensen

[11] 3,955,120
[45] May 4, 1976

[54] CIRCUIT FOR DIGITALLY CONTROLLING THE BRIGHTNESS OF THE ELECTRON BEAM OF AN ELECTRON BEAM DEFLECTION TUBE

[75] Inventor: Heinrich Jurgensen, Raisdorf, Germany

[73] Assignee: Dr. Ing. Rudolf Hell GmbH, Kiel, Germany

[22] Filed: Apr. 25, 1974

[21] Appl. No.: 463,879

[30] Foreign Application Priority Data
Apr. 26, 1973    Germany............................ 2320965

[52] U.S. Cl................................. 315/385; 315/30; 315/384
[51] Int. Cl.² .......................................... H01J 25/52
[58] Field of Search........ 315/30, 31, 381, 383–385, 315/401

[56] References Cited
UNITED STATES PATENTS

| | | |
|---|---|---|
| 2,802,071 | 8/1951 | Lin..................................... 315/401 |
| 3,281,623 | 10/1966 | Peterson et al...................... 315/384 |
| 3,403,291 | 9/1968 | Lazarchick et al. .................. 315/30 |
| 3,466,390 | 9/1969 | Inamiya et al. ....................... 315/30 |
| 3,585,299 | 6/1971 | Boekhorst............................. 315/30 |
| 3,831,057 | 8/1974 | Meyer................................... 315/30 |

*Primary Examiner*—Richard A. Farley
*Attorney, Agent, or Firm*—Ernest F. Marmorek

[57] ABSTRACT

A circuit for digitally controlling the brightness of the electron beam of an electron beam deflection tube. The circuit permits switching at a very fast rate on the order of 200 nanoseconds. To this end, a differential amplifier is used having an input and an output transistor which may be of opposite conductivity type. The circuit may be protected from saturation state by a diode and from fluctuation in temperature by a further diode and a variable capacitor may be employed for effectively neutralizing the interelectrode capacitance of the electron beam tube.

2 Claims, 8 Drawing Figures

CIRCUIT FOR DIGITALLY CONTROLLING THE BRIGHTNESS OF THE ELECTRON BEAM OF AN ELECTRON BEAM DEFLECTION TUBE

BACKGROUND OF THE INVENTION

This invention relates to a switch for digitally controlling the brightness of the electron beam of an electron beam deflection tube.

It is known to control digitally the brightness or lack of light of the electron beam by variation of the cathode potential of the deflection tube by the output signal of a switching amplifier. The amplifier in turn is controlled by a digital signal present as a square wave voltage.

In order to control the brightness of an electron beam the cathode of the beam deflection tube is connected to ground by the output signal while in order to provide a dark spot a voltage of about 40 volts is required. The output signal of the switching amplifier should follow as far as possible without time delay and without distortion the digital control signal.

Previously known switching amplifiers consist of several transistor switching stages connected in series. These stages are necessary for rotating the phase of a digital control signal and for amplifying the small aplitudes of the digital control signal to the high voltage required for controlling the darkness or black area produced by the electron beam. In view of the multiplicity of switching stages, the known switching amplifiers are expensive and require much equipment.

In order to obtain even for the usual spread between transistors a predetermined switching behavior, the transistors must be overdriven.

This results in switching times up to 500 nanoseconds (ns). In order to write short signs or letters gating times of about 200 ns are necessary. Therefore, the conventional switching amplifiers cannot fulfill this demand.

The brightness of the electron beam is determined by the voltage between control grid and cathode of the tube. This voltage must be maintained constant as long as a constant brightness is required. Therefore, the output voltage of the switching amplifier must also be maintained constant even when the transistor conducts.

For the known switching amplifiers the output voltage of the conductive transistor corresponds to its residual voltage. Due to the temperature dependence of the residual voltage the output voltage cannot be stable.

If the cathode of an electron beam deflection tube is controlled with a digital control signal having a steep slope and a large amplitude a noise signal is coupled by means of the capacitance between the control grid and the cathode from the cathode to the control grid. This overcoupling results in undesired brightness variations of the electron beam.

A further disadvantage of the known arrangements consists in that the picture contours can only be produced with insufficient sharpness. This is particularly apparent during the recording of short signs or those which rapidly follow each other.

It is accordingly an object of the present invention to provide a simplified switching amplifier which avoids the drawbacks previously discussed and which permits to provide an electron beam resulting in a constant brightness.

SUMMARY OF THE INVENTION

In accordance with the present invention a nonsaturated differential amplifier is used having an input transistor and an output transistor. The output of the output transistor is connected with the cathode of the electron beam deflection tube, the control grid of which is provided with a constant voltage. A constant voltage is applied to the base of the output transistor while the base of the output transistor is capable of having impressed thereon a digital signal for controlling the bright and dark state of the electron beam. Between the positive terminal of the voltage source and the collectors of each of the two transistors, there is connected a resistor. The resistance of the resistor of the input transistor is smaller than the resistance of the resistor of the output transistor. Finally, the cathode of a diode is connected to the collector of the output transistor, the anode of the diode being supplied with a constant voltage.

It has been found advantageous when the constant voltage applied to the base of the output transistor has approximately the value of half the amplitude of the digital control signal and the same polarity. This choice of voltage leads to a desired increase of the output voltage of the differential amplifier without a major change of its duty factor. It is advantageous when the resistance associated with the input transistor is smaller than or equal to half the resistance value of the resistor associated with the output transistor.

An essential improvement of a differential amplifier is achieved in accordance with the present invention in that the collector of the output transistor is connected with the cathode of the diode, the anode of which is connected to the output of the differential amplifier. Further, the collector of the output transistor is connected with the cathode of a further diode, the anode of which is connected to ground. The improvement consists in that the differential amplifier transmits the digital control signal almost without time delay and without distortion which makes it possible to record very short or quickly succeeding signs. Furthermore, a temperature stable output voltage is obtained by means of which the brightness of the writing beam is maintained very constant.

A further diode is advantageously connected with its anode to the output of the differential amplifier and with its cathode to the positive terminal of the voltage source. This will protect the circuit from overvoltages.

A further advantageous arrangement of the circuit consists in using an input transistor which is complementary to the output transistor, that is two transistors of the opposite conductivity type. This makes it possible to apply to the differential amplifier a digital control signal of the opposite polarity.

A particularly advantageous arrangement consists in connecting between the collector of the input transistor and the control grid of the electron tube a variable capacitor. The capacitor neutralizes effectively the undesirable tube capacitance so that the brightness variations caused by the coupled voltages are also eliminated.

An advantageous extension of the circuit consists in connecting a four-terminal network which may be active or passive and which is transit time corrected to prevent transit time distortions between the differential amplifier and the cathode of the electron beam tube. The four-terminal network predistorts the digital control signal and increases the slope of the written signs while writing with the electron beam.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
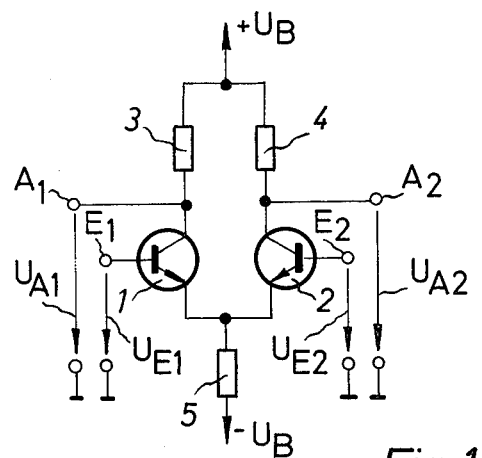
FIG. 1 shows a circuit diagram of a known differential amplifier.

Referring now to the drawings wherein like reference characters are used to designate the same elements and particularly to FIG. 1, there is illustrated a differential amplifier of a known type. The differential amplifier includes transistors 1 and 2 and collector resistors 3 and 4. By means of a resistor 5 a constant emitter current is fed to the two transistors.

Assuming that two voltages $U_{E1}$ and $U_{E2}$ are applied to the two inputs $E_1$ and $E_2$ having a terminal common with the voltage source, only the difference of the two voltages is amplified. The amplified differential voltage $\Delta U$ exists between two outputs $A_1$ and $A_2$. Accordingly, the following relationship is true $\Delta U = U_{A2} - U_{A1}$.

Figure 2:
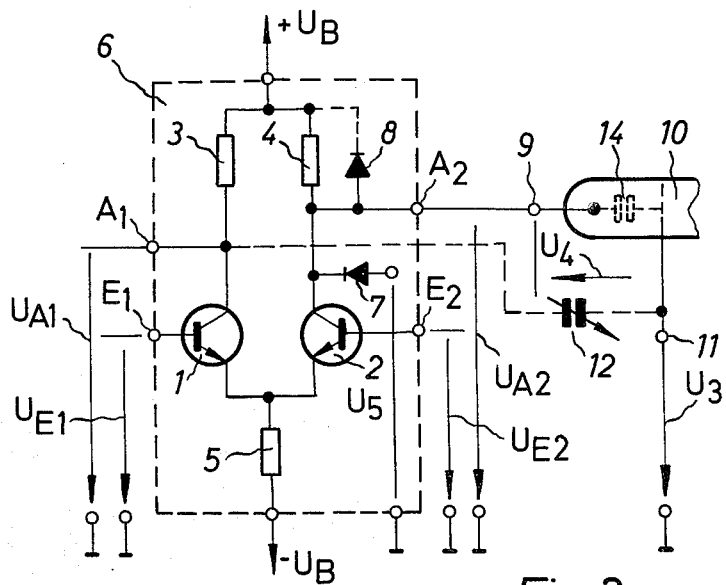
FIG. 2 is a circuit diagram of the differential amplifier of the invention and including circuit means for neutralizing the control grid - cathode capacitance.

FIG. 2 illustrates a differential amplifier 6 in accordance with the present invention. The collectors of input transistor 1 and output transistor 2 are each connected by a resistor 3 and 4 to the positive pole of a voltage source $(+U_B)$. The emitters of the two transistors 1 and 2 are connected to each other and by means of a resistor 5 with the negative terminal of a voltage source $(-U_B)$. The diode 7 is connected with its cathode to the collector of the output transistor 2 and with its anode to a constant voltage source $U_5$.

The anode of a diode 8 is connected to the collector of the output transistor 2 forming the output $A_2$ of the differential amplifier 6. The cathode of the diode 8 is connected to the positive terminal of the voltage source $(+U_B)$.

The input $E_1$ corresponds to the base of the input transistor which is supplied with the digital control signal $U_{E1}$. To the input $E_2$ corresponding to the base of the output transistor 2 there is connected a constant bias $U_{E2}$. From the output $A_2$ the output voltage $U_{A2}$ is fed to the cathode 9 of the electron beam deflection tube 10. A constant voltage $U_3$ is applied to the control grid 11 of the electron beam tube 10. The voltage $U_4$ between the control grid 11 and the cathode 9 of the electron beam tube 10 is the effective control voltage. The collector of the input transistor forms the output $A_1$ of the differential amplifier 6 with the output voltage $U_{A1}$. Between the output $A_1$ and the control grid 11 of the electron tube 10 there is connected a variable capacitor 12.

Figure 3:
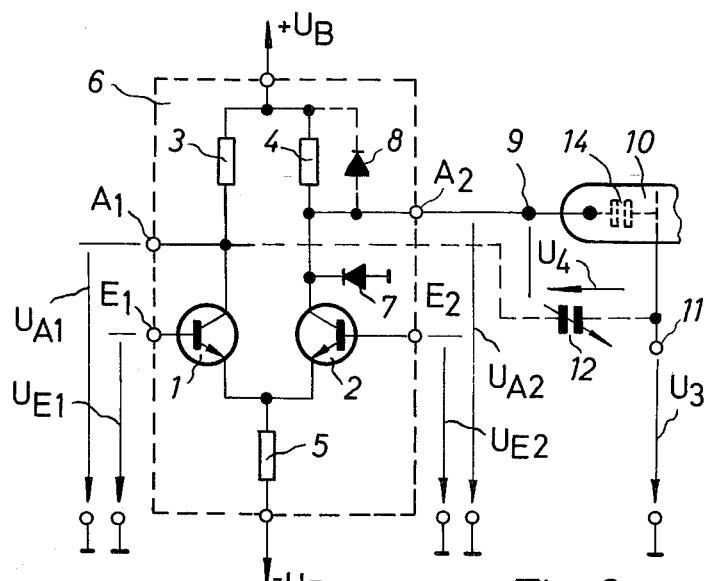
FIG. 3 is a circuit diagram of a modification of the differential amplifier of the invention and also including circuit means for neutralizing the control grid-cathode capacitance.

The circuit of FIG. 3 corresponds essentially to the differential amplifier 6 of FIG. 2 with the exception that the anode of diode 7 is not connected to the constant voltage $U_5$ but to ground.

Figure 4:
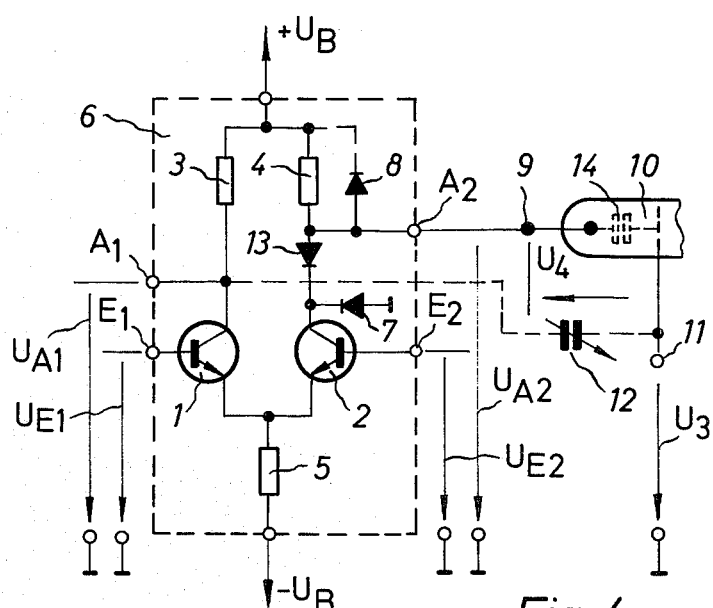
FIG. 4 is a circuit diagram of the differential amplifier of the invention including an additional diode and an interelectrode capacitance compensating element.

In the circuit of FIG. 4 the differential amplifier has been supplemented by a diode 13, the cathode of which is connected to the collector of output transistor 2 while the anode is connected to the output $A_2$ of the differential amplifier 6. The operation of the differential amplifier of FIG. 4 shall now be explained.

Figure 5:
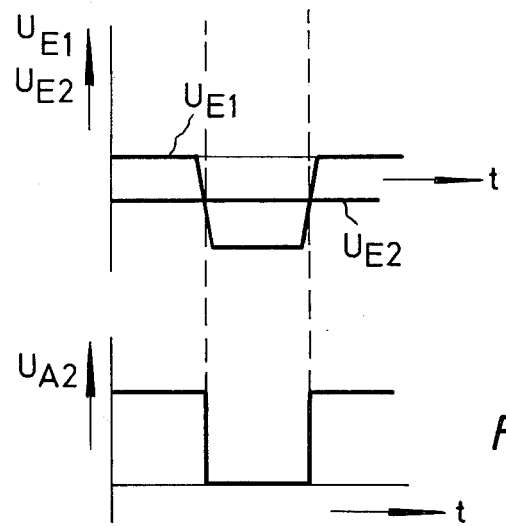
FIG. 5 is a graph showing the input and output voltages of a differential amplifier as a function of time.

The bias voltage $U_{E2}$ provides the differential amplifier 6 with a threshold behavior. It has been found to be advantageous to select the bias voltage $U_{E2} = \frac{1}{2} U_{E1}$. The variation of the voltages $U_{E1}$ and $U_{E2}$ is a function of time as shown in FIG. 5. By this selection of the bias voltage $U_{E2}$ the output voltage $U_{A2}$ is provided with a steeper slope without a major change of the duty factor and appears at the output $A_2$ of the differential amplifier 6 as shown in FIG. 5 by the output voltage $U_{A2}$. The amplitude of the input voltage $U_{E1}$ with respect to the bias voltage $U_{E2}$ determines the switching state of the differential amplifier 6.

The following switching states must be distinguished:

a. $U_{E1} > U_{E2}$: the output transistor 2 is blocked and the output voltage $U_{A2}$ is equal to the positive voltage source $(+U_B)$. The electron tube 10 is controlled to be dark. Small variations of the positive voltage source $(+U_B)$ have no influence upon the dark state of the electron beam tube 10.

b. $U_{E1} < U_{E2}$: In this case, the output transistor 2 is conductive. The diode 7 prevents that the output transistor 2 is driven into saturation because when the diode 7 conducts the collector potential of the output transistor 2, it is approximately at ground potential.

The forward voltage of diode 7 and its variation with temperature are compensated by the diode 13.

As explained before, the resistance of resistor 3 should be smaller than that of resistor 4. Preferably and advantageously, the resistance of resistor 3 should be smaller than or equal to one-half the resistance of the resistor 4. This avoids that the input transistor 1 is overdriven. On the other hand, approximately equal operating points for the diodes 7 and 13 are obtained with a corresponding division of the current flow.

In that the saturation of transistors 1 and 2 is prevented, the differential amplifier 6 has very short switching time. The output voltage $U_{A2}$ has therefore a very steep slope and follows the digital control signal almost distortion free. Furthermore, during the time, in which the output transistor 2 conducts, the output voltage $U_{A2}$ and the effective voltage $U_4$ which provides the brightness control and which follows from the voltage relationship $U_4 = U_3 - U_{A2}$ are temperature stable.

A protection of the circuit from overvoltages which may occur during breakdown voltage within the electron tube is obtained by the diode 8. The diode 8 limits the maximum value of the output voltage $U_{A2}$ of the differential amplifier 6 to the positive voltage supply (+$U_B$).

It may be further mentioned that the differential amplifier 6 as described herein may also be used for controlling the control grid voltage of an electron beam tube. The differential amplifier 6 may also be made from pnp transistors in which case the voltages and the polarities of the diodes should be correspondingly reversed.

Figure 6:
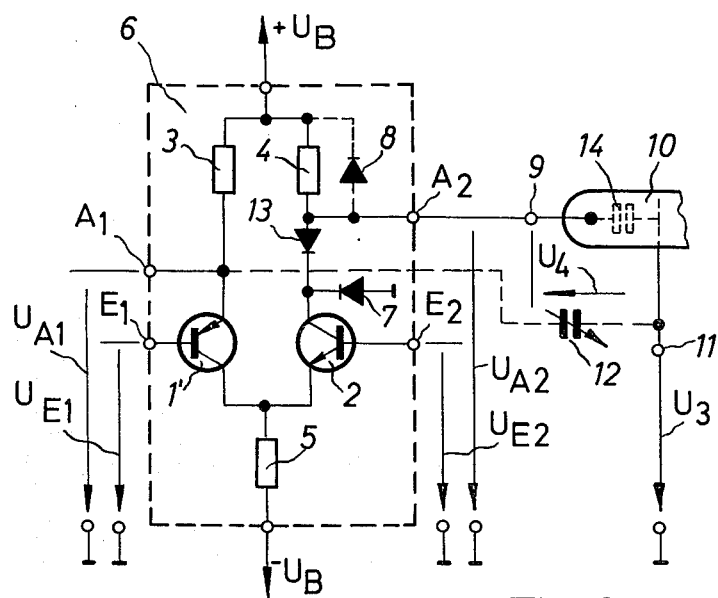
FIG. 6 is a circuit diagram of a differential amplifier including two complementary transistors.

A further variation of the differential amplifier is illustrated in FIG. 6. In order to apply to the differential amplifier a control signal of opposite polarity the input transistor 1' may be complementary, that is of the opposite conductivity type with respect to that of the output transistor 2.

As also shown in FIG. 4, the output voltage $U_{A1}$ of the differential amplifier 6 is coupled by the variable capacitor 12 to the grid 11 of the electron tube 10 for neutralizing the undesirable control grid - cathode capacitance 14. The output voltage $U_{A1}$ is opposite in phase with respect to the output voltage $U_{A2}$. In view of the very short switching times of the differential amplifier 6, the phase shift of the output voltage $U_{A1}$ is very exactly 180° which causes an exact neutralization.

Figure 7:
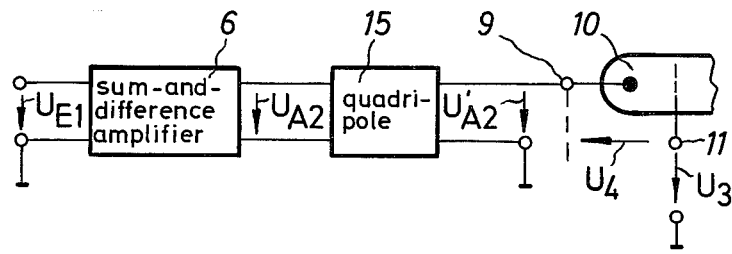
FIG. 7 is a block diagram including a four-terminal network for predistorting the digital control signal.

In FIG. 7 there is shown in block form an arrangement whereby the edges of written signs may be provided with steep slopes. To this end an active or passive four-terminal network 15 is connected between the differential amplifier 6 and the cathode 9. The four-terminal network is transit time corrected. The control grid 11 of the electron tube 10 is supplied with a constant voltage $U_3$. The voltage $U_4$ is the effective control voltage between grid 11 and cathode 9. The output voltage $U_{A2}$ of the differential amplifier 6 is predistorted by the four-terminal network 15. The predistorted voltage $U'_{A2}$ is applied to the cathode 9 of the electron tube 10.

Figure 8:
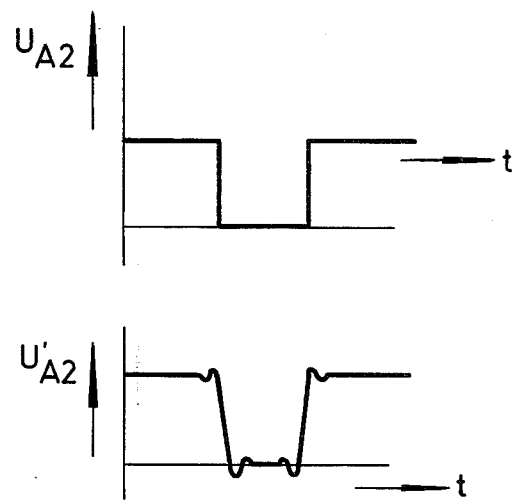
FIG. 8 is a graph of the input and output voltages of the four-terminal network as a function of time.

The four-terminal network 15 may, for example, consist of a transit time corrected low-pass filter. Its output voltage $U'_{A2}$ is predistorted by a predetermined over shoot at the leading end trailing edges as illustrated in FIG. 8. The voltage $U_4$ effective for controlling the brightness is also predistorted according to the voltage relationship $U_4 = U_3 - U_{A2}$ so that the edges of the written signs have a steeper slope.

What is claimed is:

1. A circuit for digitally controlling the brightness and darkness of an electron beam of an electron beam tube having a cathode and control grid, said circuit comprising, in combination:

a differential amplifier including input and output transistors each having an emitter, base, and collector;

a first D.C. voltage source having a substantially constant voltage amplitude connected between said control grid and ground;

a second D.C. voltage source having a substantially constant voltage amplitude connected between the base of said output transistor and ground;

a third D.C. voltage source having a positive terminal;

a first resistor connected between said positive terminal and the collector of said input transistor;

a first diode having its cathode connected to the collector of said output transistor;

a second resistor connected between said positive terminal and the anode of said first diode;

the resistance of said first resistor being smaller than said second resistor;

a second diode having its cathode connected to the collector of said output transistor and its anode connected to ground; and a third diode having its cathode connected to said positive terminal and its anode connected to the anode of said first diode, whereby the base of said input transistor can be supplied with a digital signal for controlling the brightness and darkness of said electron beam.

2. The circuit as claimed in claim 1, further comprising a variable capacitor connected between the collector of said input transistor and said control grid.

* * * * *